(12) United States Patent
Zhan et al.

(10) Patent No.: US 10,856,438 B2
(45) Date of Patent: Dec. 1, 2020

(54) FAN CONTROL CIRCUIT AND FAN CONTROL SYSTEM

(71) Applicants: INVENTEC (PUDONG) TECHNOLOGY CORPORATION, Shanghai (CN); INVENTEC CORPORATION, Taipei (TW)

(72) Inventors: Peng Zhan, Shanghai (CN); Jiang-Tao Yuan, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 121 days.

(21) Appl. No.: 16/214,753

(22) Filed: Dec. 10, 2018

(65) Prior Publication Data
US 2020/0146179 A1 May 7, 2020

(30) Foreign Application Priority Data
Nov. 6, 2018 (CN) .......................... 2018 1 1313553

(51) Int. Cl.
G06F 1/26 (2006.01)
H05K 7/20 (2006.01)
G05D 23/19 (2006.01)
G06F 1/20 (2006.01)

(52) U.S. Cl.
CPC ..... *H05K 7/20209* (2013.01); *G05D 23/1934* (2013.01); *H05K 7/20836* (2013.01); *G06F 1/206* (2013.01); *H05K 7/20718* (2013.01)

(58) Field of Classification Search
CPC .......... G06F 1/206; G06F 1/3203; G06F 1/26; G06F 11/3055; G06F 13/4282; H05K 7/20209; H05K 7/20836; H05K 7/20718; G05D 23/1917; G05D 23/1934
See application file for complete search history.

(56) References Cited

U.S. PATENT DOCUMENTS

| | | | | |
|---|---|---|---|---|
| 7,375,486 B2 * | 5/2008 | Ku | ........................... | G06F 1/206 318/471 |
| 8,099,617 B2 * | 1/2012 | Kim | ........................ | G06F 1/263 713/300 |
| 8,606,429 B2 * | 12/2013 | Lin | ....................... | G05B 19/042 700/304 |
| 9,136,779 B2 * | 9/2015 | Busch | ........................ | H02P 1/04 |
| 9,918,410 B2 * | 3/2018 | Humphrey | ......... | H05K 7/20718 |
| 10,060,438 B2 * | 8/2018 | Duan | ..................... | F04D 19/005 |
| 2003/0137267 A1 * | 7/2003 | Blake | ..................... | F04D 27/004 318/471 |
| 2019/0235592 A1 * | 8/2019 | Huang | ........................ | G06F 1/20 |
| 2019/0390864 A1 * | 12/2019 | Lambert | ............... | H02P 27/026 |

* cited by examiner

*Primary Examiner* — Thai T Dinh
(74) *Attorney, Agent, or Firm* — Maschoff Brennan

(57) ABSTRACT

A fan control circuit comprises: a fan controller connected with at least one fan connector, connected with a baseboard management controller (BMC) via integrated circuit bus communication lines and outputting a BMC fan signal wherein said fan controller is powered by a main power supply, and a baseboard status detection circuit connected with the BMC and the fan controller respectively, detecting a heartbeat signal of the BMC, and controlling an output of a fan pulse signal according to the heartbeat signal so as to control a fan connected with the fan controller to operate normally.

12 Claims, 5 Drawing Sheets

FAN CONTROL CIRCUIT AND FAN CONTROL SYSTEM

CROSS-REFERENCE TO RELATED APPLICATIONS

This non-provisional application claims priority under 35 U.S.C. § 119(a) on Patent Application No(s). 201811313553.7 filed in China on Nov. 6, 2018, the entire contents of which are hereby incorporated by reference.

BACKGROUND

1. Technical Field

This disclosure relates to a server technical field, particularly to a server cooling technical field, and specifically to a fan control circuit and a fan control system.

2. Related Art

With the development of the Internet, the requirements for computing storage capacity, control of power consumption, and stability of the server is increasing. As a result, the price of the server also becomes higher. The server is requested to continuously run the whole day of 24 hours; that is, one requirement for the server is that any abnormality should not affect the normal operation of the system and not lead to component failure or even burned components.

The abnormality of the fan control system in the server must lead to poor heat dissipation of the server system, which causes the server to be unable to operate or even to be burned to result in a fire. This loss cannot be estimated and the consequences are very serious. Therefore, the protection against abnormality is particularly important. But unfortunately, just N+1 redundancy of the fan and the ways to deal with BMC abnormal situations are considered in the conventional design of the fan control system in the server.

SUMMARY

The fan control circuit comprises: a fan controller connected with at least one fan connector, connected with a baseboard management controller via integrated circuit bus communication lines and outputting a baseboard management controller fan signal, wherein said fan controller is powered by a main power supply; and a baseboard status detection circuit connected with the baseboard management controller and the fan controller respectively, detecting a heartbeat signal of the baseboard management controller, and controlling an output of a fan pulse signal according to the heartbeat signal so as to control a fan connected with the fan controller to operate normally.

According to an embodiment of the present disclosure, the baseboard status detection circuit comprises: a heartbeat signal detection circuit connected with an output terminal of the heartbeat signal of the baseboard management controller, detecting the heartbeat signal of the baseboard management controller and outputting a heartbeat status signal; and a logic control circuit connected with the heartbeat signal detection circuit, and controlling an output of pulse selection signal according to the heartbeat status signal.

According to an embodiment of the present disclosure, the baseboard status detection circuit further comprises: a pulse generator generating a predetermined fan pulse signal for driving the fan to operate normally; and a pulse multiplexer connected with the logic control circuit, the pulse generator and the fan controller respectively, wherein the pulse multiplexer chooses to output the predetermined fan pulse signal to an output port of the pulse multiplexer when the pulse selection signal indicates a first selection status, and the pulse multiplexer chooses to output the baseboard management controller fan signal to the output port of the pulse multiplexer when the pulse selection signal indicates a second selection status.

According to an embodiment of the present disclosure, the fan connector is electrically connected with the fan controller, and the fan connector detects an operating speed of the fan and outputs the operating speed to the fan controller.

According to an embodiment of the present disclosure, the logic control circuit is further connected with the baseboard management controller, and when the integrated circuit bus communication lines carry a failure signal, the baseboard management controller transmits a failure status signal of integrated circuit bus communication to the logic control circuit.

According to an embodiment of the present disclosure, the fan control circuit further comprises a power supply circuit connected with the fan connector, and the power supply circuit comprises a backup power supply and a control switch connected with the backup power supply, the output port of the pulse multiplexer and the fan connector respectively.

According to an embodiment of the present disclosure, the control switch controls the fan connector to have a communication connection with the output port of the pulse multiplexer when the main power supply of the fan controller operates normally, and the control switch controls the fan of the fan connector to run at full speed when the main power supply of the fan controller is interrupted.

According to an embodiment of the present disclosure, the fan control circuit further comprises a first fuse and a second fuse respectively connected with the main power supply. The first fuse and the second fuse are respectively and correspondingly connected with two rotors of the fan, and respectively provide fused protection to the two rotors.

The present disclosure further provides a fan control system, comprising a mainboard, a baseboard management controller disposed on the mainboard, a fan control board and the above fan control circuit.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
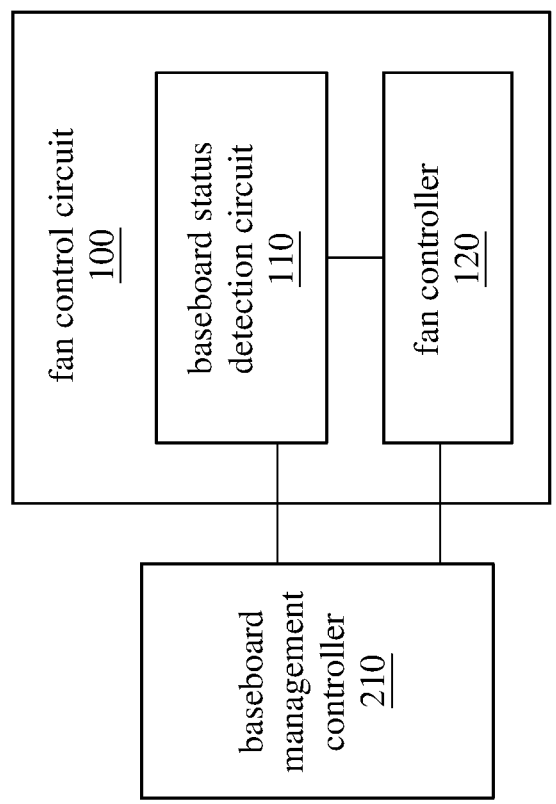
FIG. 1 is a schematic diagram of a fan control circuit in an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Please refer to FIGS. 1-5. It should be understood that the structures, proportions and sizes illustrated in the drawing of this specification are merely provided in conjunction with the content disclosed in the specification for a person having ordinary skills in the art to understand and read the present invention. These structures, ratios and sizes are not intended to limit the conditions that can be implemented by the present invention, and therefore have no technical significance. Any modification of the structure, change of the proportional relationship or adjustment of the size should still fall within the scope of the technical content disclosed by the present invention if it does not influence the efficacy and purpose that can be achieved by the present invention.

The purpose of one or more embodiments of the present disclosure is to provide a fan control circuit and a fan control system for overcoming the problem that an effective protection cannot be effectively provided when a fan control system in a server is abnormal.

The principle and implementation of a fan control circuit and a fan control system of this embodiment will be described in detail as follows, so that the fan control circuit and the fan control system of this embodiment can be understood by a person having ordinary skills in the art without any creative work.

As shown in FIGS. 1-5, this embodiment provides a fan control circuit 100 and a fan control system, applied to a server. As shown in FIG. 1, the fan control circuit 100 comprises a fan controller 120 and a baseboard status detection circuit 110.

In this embodiment, the fan controller 120 is connected with at least one fan connector 300, connected with a baseboard management controller (BMC) 210 via integrated circuit bus communication lines, and outputs a baseboard management controller fan signal. The fan controller 120 is powered by a main power supply.

In this embodiment, the fan connector 300 is electrically connected with the fan controller 120, and the fan connector 300 detects the operating speed of the fan and outputs the operating speed to the fan controller 120.

For example, in this embodiment, the fan controller 120 is connected with the BMC 210 preferably via I²C bus communication lines.

In this embodiment, the fan controller 120 uses an integrated fan control chip interface, so that in comparison with being directly connected with the BMC 210, the number of the connected communication lines is significantly decreased, and the stability of the server system may be effectively improved.

Moreover, since the fan controller 120 uses the integrated fan control chip, the interface between the mainboard 200 and the fan control board 10 is simpler, and the fan control system is more sturdy and stable.

In this embodiment, the baseboard status detection circuit 110 is connected with the baseboard management controller 210 and the fan controller 120 respectively, detects a heartbeat signal of the baseboard management controller 210, and outputs a fan pulse signal according to the heartbeat signal so as to control the fan connected with the fan connector 300 to operate normally.

Figure 2:
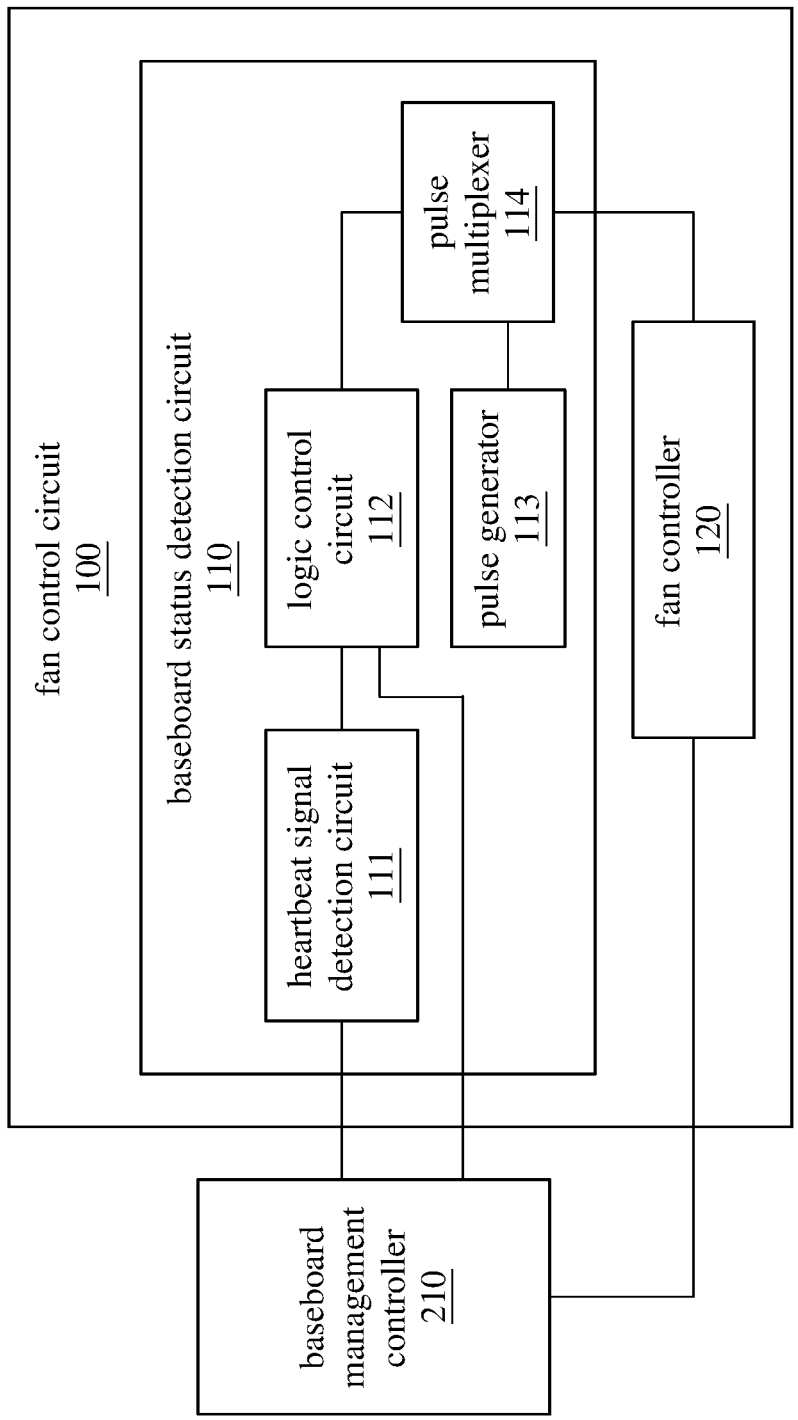
FIG. 2 is a schematic diagram of a baseboard status detection circuit in an embodiment of the present disclosure.

More specifically, as shown in FIG. 2, in this embodiment, the baseboard status detection circuit 110 comprises a heartbeat signal detection circuit 111 and a logic control circuit 112.

Figure 5:
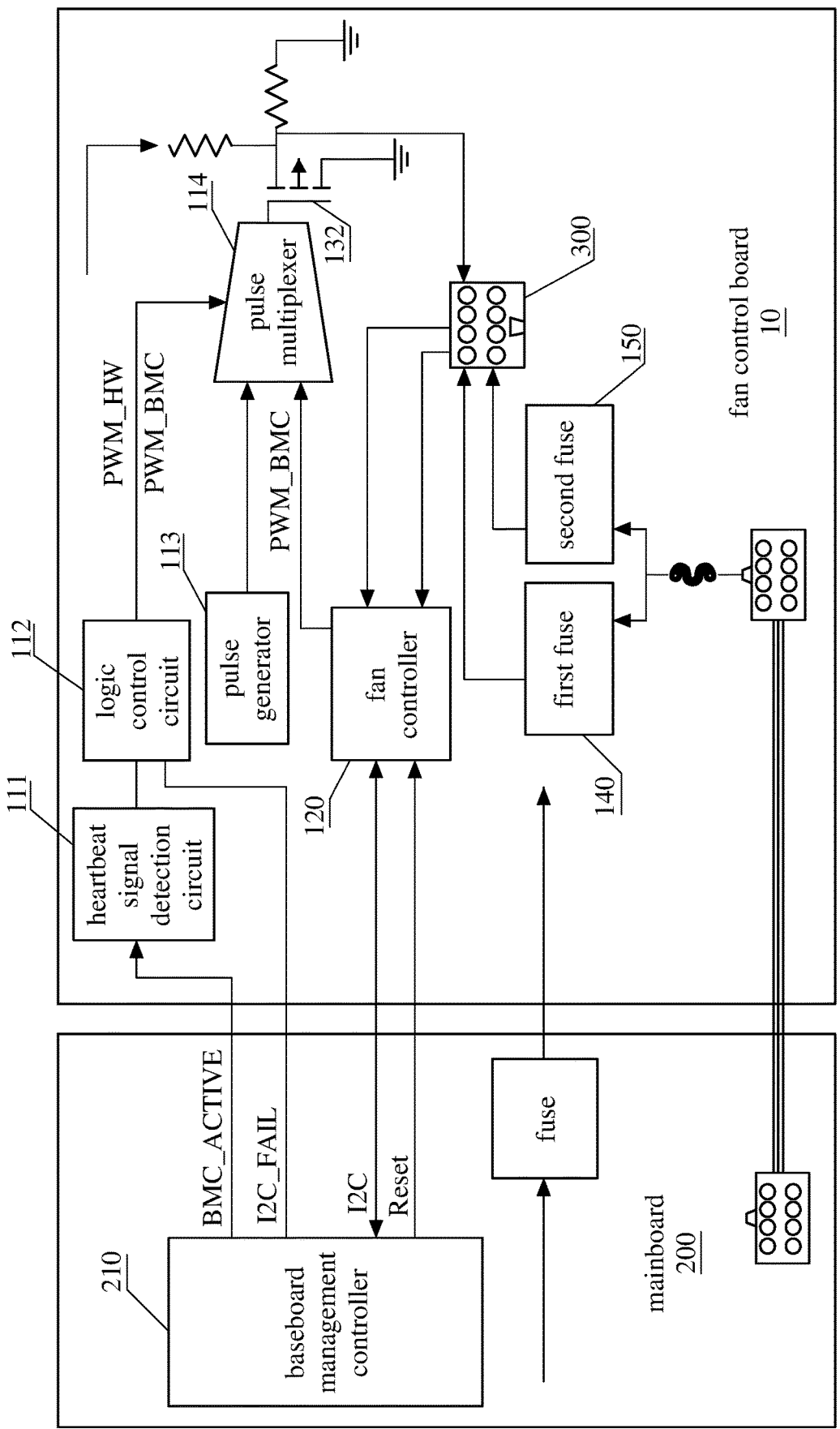
FIG. 5 is an overall schematic diagram of a fan control system in an embodiment of the present disclosure.

In this embodiment, the heartbeat signal detection circuit 111 is connected with the output terminal of heartbeat signal (i.e. BMC ACTIVE as shown in FIG. 5) of the baseboard management controller 210, and detects the heartbeat signal of the baseboard management controller 210 to output a heartbeat status signal.

When the BMC 210 operates in a normal status (i.e. BMC active), the BMC 210 can normally access the fan controller 120 through I²C bus communication. At this time, according to the collected information such as the server system temperature, the BMC 210 generates a baseboard management controller fan signal, that is, to generate a PWM pulse signal with a proper duty ratio for keeping the fan operating normally.

In this embodiment, the logic control circuit 112 is connected with the heartbeat signal detection circuit 111, and outputs a pulse selection signal according to the heartbeat status signal.

As shown in FIG. 5, the pulse selection signal comprises a first selection status (PWM_HW) and a second selection status (PWM_BMC). The first selection status (PWM_HW) or the second selection status (PWM_BMC) is controlled to be outputted according to the fact whether the heartbeat status signal is normal or not. The first selection status (PWM_HW) and the second selection status (PWM_BMC) are differentiated by different power levels. For example, the first selection status (PWM_HW) is represented by the low level 0, and the second selection status (PWM_BMC) is represented by the high level 1, but are not limited to these. In another example, the first selection status (PWM_HW) is represented by the high level 1, and the second selection status (PWM_BMC) is represented by the low level 0. In this embodiment, the status columns are merely used as an example, but the specific status values are not limited. In this embodiment, for convenience of explanation, the first selection status (PWM_HW) is exemplarily described as the low level 0, and the second selection status (PWM_BMC) is exemplarily described as the high level 1.

As shown in FIG. 2, in this embodiment, the baseboard status detection circuit 110 further comprises a pulse generator 113 and a pulse multiplexer 114.

In this embodiment, the pulse generator 113 generates a predetermined fan pulse signal for driving the fan to operate normally.

In this embodiment, the pulse multiplexer 114 is connected with the logic control circuit 112, the pulse generator 113 and the fan controller 120 respectively. When the pulse selection signal indicates a first selection status, the pulse multiplexer 114 chooses to output the predetermined fan pulse signal to output port of the pulse multiplexer 114; when the pulse selection signal indicates a second selection status, the pulse multiplexer 114 chooses to output the baseboard management controller fan signal to the output port of the pulse multiplexer 114.

In other words, in this embodiment, when the BMC 210 operates normally, the heartbeat signal detection circuit 111 detects the heartbeat signal (ACTIVE signal) emitted by the BMC 210, so the logic control circuit 112 outputs the second selection status, wherein the selection signal is 1; thereby, the pulse multiplexer 114 chooses to output the baseboard management controller fan signal to the output port of the pulse multiplexer 114, so as to keep the fan operating normally through the baseboard management controller fan signal generated by the BMC 210 (i.e. PWM pulse signal with a proper duty ratio).

When the BMC 210 is abnormal or crashes, the heartbeat signal detection circuit 111 cannot detect the heartbeat signal (ACTIVE signal) emitted by the BMC 210, so the logic control circuit 112 outputs the first selection status, wherein the selection signal is 0; thereby, the pulse generator 113 is selected to generate the predetermined fan pulse signal for driving the fan to operate normally, and the pulse multiplexer 114 chooses to output the predetermined fan pulse signal to the output port of the pulse multiplexer 114. The duty ratio of this predetermined fan pulse signal may keep the system operating normally under any loading.

Therefore, the fan control circuit 100 of this embodiment may effectively avoid the situation where the fan cannot operate normally and the server system is abnormal since the BMC 210 is abnormal or the program of the BMC 210 crashes.

In this embodiment, the logic control circuit 112 is further connected with the baseboard management controller 210. When the integrated circuit bus communication lines carry a failure signal, the baseboard management controller 210 transmits a failure status signal of integrated circuit bus communication to the logic control circuit 112.

In this embodiment, the integrated circuit bus communication lines are exemplarily described as a I$^2$C communication bus. As shown in FIG. 5, when the I$^2$C communication bus carries a failure signal, the baseboard management controller 210 transmits a failure status signal of the I$^2$C communication bus (I2C_FAIL) to the logic control circuit 112.

Moreover, when the fan controller 120 is abnormal, the I$^2$C communication bus is abnormal, or a read-write register fails, the BMC 210 can send a reset signal (Reset) to the fan controller 120 so as to reset the fan controller 120.

When the BMC 210 is in a normal status (i.e. BMC active), the failure status signal of the I$^2$C communication bus (I2C_FAIL) is, for example, set to a high level, and simultaneously, the reset signal (Reset) is at a high level, and a square-wave signal is outputted to the fan controller to show that the BMC 210 itself is in a normal working status.

When the fan controller 120 is abnormal, the I$^2$C communication bus is abnormal, or a read-write register fails, the BMC 210 will firstly reset the fan controller 120 and then determine whether it returns to normal. If the fan controller 120 can still not return to normal, the BMC 210 pulls down the failure status signal of the I$^2$C communication bus (I2C_FAIL) to make the failure status signal of the I$^2$C communication bus (I2C_FAIL) become a low level and be transmitted to the logic control circuit 112, so that the fan pulse signal for controlling the fan switches to the predetermined fan pulse signal generated by the pulse generator 113 for driving the fan to operate normally. The predetermined fan pulse signal can absolutely ensure that the fan of the server system normally operates at a normal rotational speed.

Moreover, when the I$^2$C communication bus is broken, the failure status signal of the I$^2$C communication bus (I2C_FAIL) is also at a low level, and the logic control circuit 112 outputs the first selection status (PWM_HW), so that the fan pulse signal for controlling the fan also switches to the predetermined fan pulse signal generated by the pulse generator 113 for driving the fan to operate normally. The predetermined fan pulse signal can absolutely ensure that the fan of the server system normally operates at a normal rotational speed.

Therefore, the fan control circuit 100 of this embodiment may effectively avoid the situation where the fan cannot operate normally and the server system is abnormal since the fan controller 120 is abnormal, and also effectively avoid the situation where the fan cannot operate normally and the server system is abnormal since the control signal lines (cable wires) from the mainboard 200 to the fan control board 10 are partially or completely broken.

Figure 3:
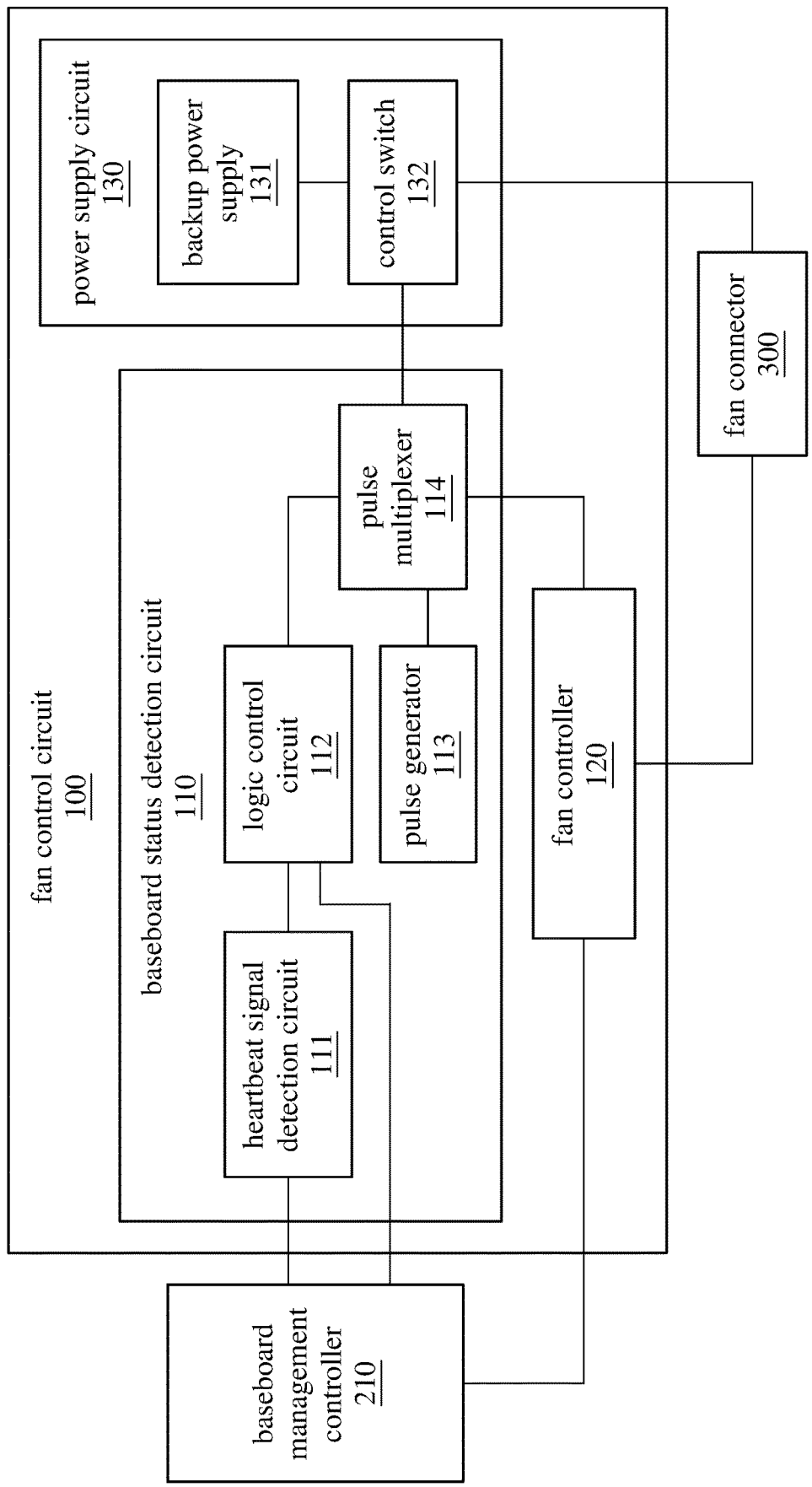
FIG. 3 is a preferred schematic diagram of a fan control circuit in an embodiment of the present disclosure.

In this embodiment, as shown in FIG. 3, the fan control circuit 100 further comprises a power supply circuit 130 which is connected with the fan connector 300.

The power supply circuit 130 comprises a backup power supply 131 and a control switch 132.

In this embodiment, the control switch 132 is connected with the backup power supply 131, the output port of the pulse multiplexer 114 and the fan connector 300 respectively.

The control switch 132 is, for example but not limited to, a switch commonly used in an electronic circuit system such as a MOS transistor. In this embodiment, the control switch 132 is exemplarily described as a MOS transistor, and the backup power supply 131 is exemplarily described as a 12V power supply.

More specifically, in this embodiment, when the main power supply of the fan controller 120 operates normally, the control switch 132 controls the fan connector 300 to have communication connection with the output port of the pulse multiplexer 114; when the main power supply of the fan controller 120 is interrupted, the control switch 132 controls the fan of the fan connector 300 to run at full speed.

More specifically, as shown in FIG. 5, when the I$^2$C communication bus is broken, or a break or a short occurs at the lines of the main power supply, no main power supply provides electric power for the fan control. At this time, since the MOS transistor is connected with the predetermined fan pulse signal selected by the pulse multiplexer 114 to be outputted, the predetermined fan pulse signal is pulled up by dividing voltage by the 12V backup power supply 131, the duty ratio of the fan pulse signal is 100%, and the fan operates at full speed rather than not operates, which resulting in the abnormal status of the server system or even the burned board.

Therefore, the fan control circuit 100 of this embodiment may effectively avoid the situation where the fan cannot operate normally and the server system is abnormal since the I$^2$C communication bus is broken, or a break or a short occurs at the lines of the main power supply.

Figure 4:
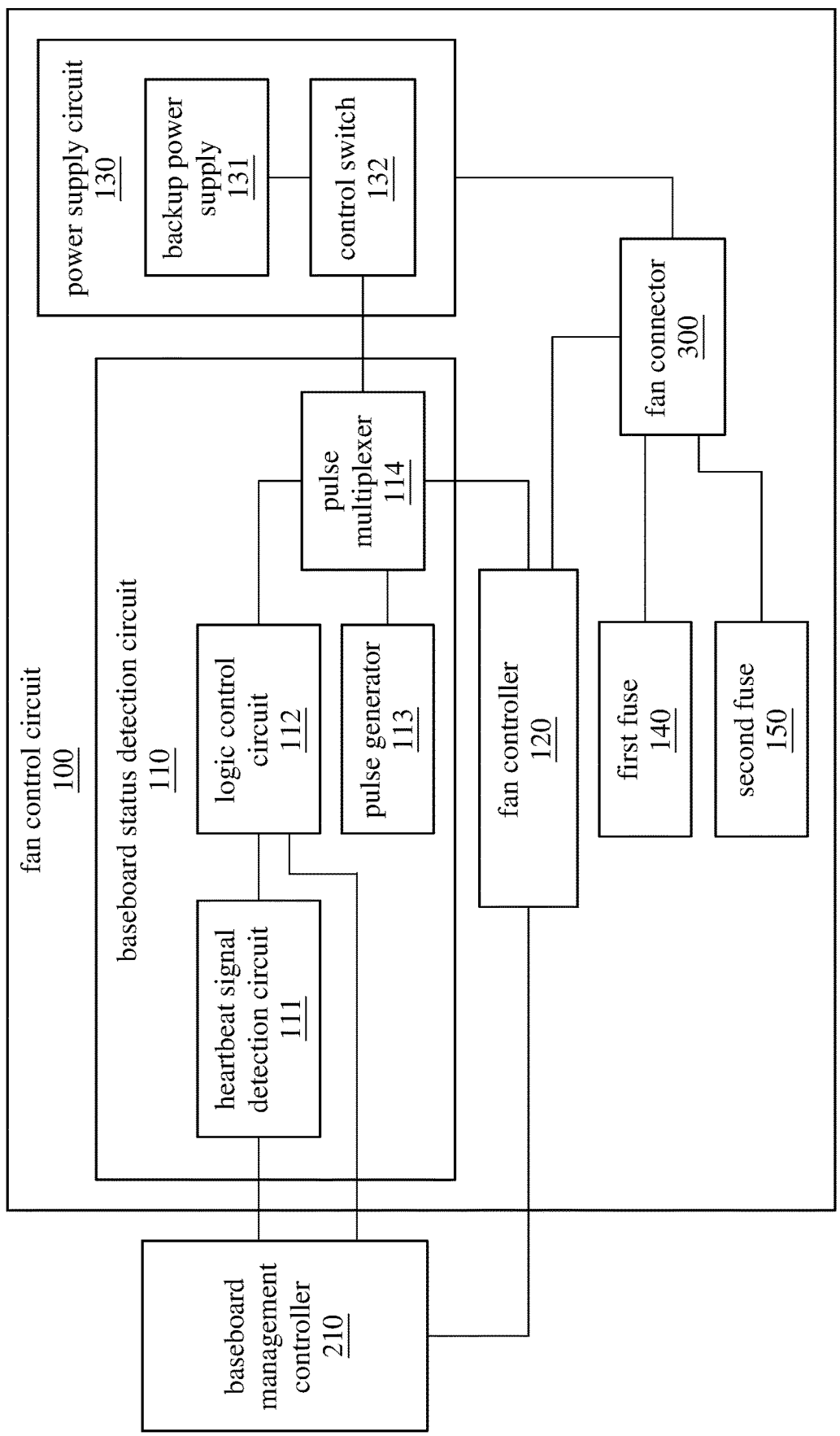
FIG. 4 is another preferred schematic diagram of a fan control circuit in an embodiment of the present disclosure.

In this embodiment, as shown in FIG. 4, the fan control circuit 100 further comprises a first fuse 140 and a second fuse 150.

The first fuse 140 and the second fuse 150 are respectively connected with the main power supply; the first fuse 140 and the second fuse 150 are respectively and correspondingly connected with two rotors of the fan, and respectively provide fused protection to the two rotors.

The two fuses, the first fuse 140 and the second fuse 150, are used in a double-rotor fan to respectively provide fused protection to the two rotors, so that when one rotor in the fan is abnormal or has a short circuit, the other rotor may not be impacted. Therefore, in comparison with a single fuse for protecting a single rotor, this redundant design may provide a dual protection for the fan. Since N+1 redundancy of the fan becomes 2N+1 redundancy, the fans with the lower performance but the better cost benefit may be chosen, so that the power consumption of the fan may not be too excessive due to the over design, and the cost of the fan may be effectively reduced.

Moreover, as shown in FIG. 5, this embodiment further provides a fan control system comprising a mainboard 200, a baseboard management controller 210 disposed on the mainboard 200, a fan control board 10 and the fan control circuit 100 as described above, which is disposed on the fan control board 10.

The fan control circuit 100 is described in detail above so the related details are not repeated herein.

Moreover, in order to highlight the innovative part of the present invention, the technical features that are not closely related to solving the technical problem proposed by the present invention are not introduced in this embodiment, but it does not indicate that there are no other structural and functional features in this embodiment.

It should be noted that the drawings provided in this embodiment merely illustrate the basic concept of this invention in a schematic manner. The drawings merely show the components related to this invention, rather than are drawn according to the numbers, shapes and sizes of components in actual implementation. The types, numbers and proportions of the components in actual implementation can be freely changed, and the arrangement of the components can be more complicated.

In view of the above description, not only the N+1 redundancy of the baseboard management controller (BMC) and the fan but also abnormality detection and protection for each stage of the entire fan control system are considered in the present disclosure, so as to provide the more stable and complete protection for the fan control system when the fan control system is abnormal. Therefore, the present disclosure may effectively overcome various disadvantages in the prior art and have high industrial utilization value.

The above embodiments are merely illustrative of the principles and efficacy of the invention, but are not intended to limit this invention. Modifications or variations of the above-described embodiments may be made by those skilled in the art without departing from the spirit and scope of this invention. Therefore, all equivalent modifications or changes made by those skilled in the art without departing from the spirit and scope of the invention should be covered by the appended claims.

What is claimed is:

1. A fan control circuit, applied to a server, comprising:
a fan controller connected with at least one fan connector, connected with a baseboard management controller via integrated circuit bus communication lines and outputting a baseboard management controller fan signal, wherein said fan controller is powered by a main power supply; and
a baseboard status detection circuit connected with the baseboard management controller and the fan controller respectively, detecting a heartbeat signal of the baseboard management controller, and controlling an output of a fan pulse signal according to the heartbeat signal so as to control a fan connected with the fan controller to operate normally;
wherein the baseboard status detection circuit comprises:
a heartbeat signal detection circuit connected with an output terminal of the heartbeat signal of the baseboard management controller, detecting the heartbeat signal of the baseboard management controller and outputting a heartbeat status signal; and
a logic control circuit connected with the heartbeat signal detection circuit, and controlling an output of pulse selection signal according to the heartbeat status signal;
wherein the baseboard status detection circuit further comprises:

a pulse generator generating a predetermined fan pulse signal for driving the fan to operate normally; and
a pulse multiplexer connected with the logic control circuit, the pulse generator and the fan controller respectively, wherein the pulse multiplexer chooses to output the predetermined fan pulse signal to an output port of the pulse multiplexer when the pulse selection signal indicates a first selection status, and the pulse multiplexer chooses to output the baseboard management controller fan signal to the output port of the pulse multiplexer when the pulse selection signal indicates a second selection status.

2. The fan control circuit according to claim 1, wherein the fan connector is electrically connected with the fan controller, and the fan connector detects an operating speed of the fan and outputs the operating speed to the fan controller.

3. A fan control system, comprising a mainboard, a baseboard management controller disposed on the mainboard, a fan control board and the fan control circuit according to claim 2.

4. The fan control circuit according to claim 1, wherein the logic control circuit is further connected with the baseboard management controller, and when the integrated circuit bus communication lines carry a failure signal, the baseboard management controller transmits a failure status signal of integrated circuit bus communication to the logic control circuit.

5. A fan control system, comprising a mainboard, a baseboard management controller disposed on the mainboard, a fan control board and the fan control circuit according to claim 4.

6. The fan control circuit according to claim 1, further comprising a power supply circuit connected with the fan connector, wherein the power supply circuit comprises:
a backup power supply; and
a control switch connected with the backup power supply, the output port of the pulse multiplexer and the fan connector respectively.

7. The fan control circuit according to claim 6, wherein the control switch controls the fan connector to have a communication connection with the output port of the pulse multiplexer when the main power supply of the fan controller operates normally, and the control switch controls the fan of the fan connector to run at full speed when the main power supply of the fan controller is interrupted.

8. A fan control system, comprising a mainboard, a baseboard management controller disposed on the mainboard, a fan control board and the fan control circuit according to claim 7.

9. A fan control system, comprising a mainboard, a baseboard management controller disposed on the mainboard, a fan control board and the fan control circuit according to claim 6.

10. The fan control circuit according to claim 1, further comprising:
a first fuse and a second fuse respectively connected with the main power supply;
wherein the first fuse and the second fuse are respectively and correspondingly connected with two rotors of the fan, and respectively provide fused protection to the two rotors.

11. A fan control system, comprising a mainboard, a baseboard management controller disposed on the mainboard, a fan control board and the fan control circuit according to claim 10.

12. A fan control system, comprising a mainboard, a baseboard management controller disposed on the mainboard, a fan control board and the fan control circuit according to claim 1.

* * * * *